(12) United States Patent
Kim et al.

(10) Patent No.: US 9,214,349 B2
(45) Date of Patent: Dec. 15, 2015

(54) METHOD FOR MANUFACTURING SEMICONDUCTOR DEVICE

(71) Applicant: Samsung Electronics Co., Ltd., Suwon-si, Gyeonggi-do (KR)

(72) Inventors: Ju-Youn Kim, Suwon-si (KR); Je-Don Kim, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/650,784

(22) Filed: Oct. 12, 2012

(65) Prior Publication Data

US 2014/0103403 A1     Apr. 17, 2014

(51) Int. Cl.
| | | |
|---|---|---|
| H01L 21/283 | (2006.01) | |
| H01L 21/28 | (2006.01) | |
| H01L 21/8234 | (2006.01) | |
| H01L 29/66 | (2006.01) | |
| H01L 21/768 | (2006.01) | |

(52) U.S. Cl.
CPC .... H01L 21/28247 (2013.01); H01L 21/76801 (2013.01); H01L 21/76829 (2013.01); H01L 21/82345 (2013.01); H01L 21/823418 (2013.01); H01L 21/823475 (2013.01); *H01L 21/76897* (2013.01); *H01L 29/66545* (2013.01)

(58) Field of Classification Search
CPC . H01L 21/283; H01L 29/78; H01L 21/76801; H01L 21/28088; H01L 21/823475
USPC ................ 257/288, E21.9, E29.255; 438/592
See application file for complete search history.

(56) References Cited

U.S. PATENT DOCUMENTS

| | | | | |
|---|---|---|---|---|
| 6,303,418 | B1 * | 10/2001 | Cha et al. ...................... | 438/199 |
| 6,417,055 | B2 | 7/2002 | Jang et al. | |
| 6,887,747 | B2 * | 5/2005 | Yagishita et al. ............. | 438/197 |
| 7,018,873 | B2 | 3/2006 | Dennard et al. | |
| 8,084,311 | B1 * | 12/2011 | Horak et al. .................. | 438/183 |
| 8,669,618 | B2 * | 3/2014 | Fu et al. ........................ | 257/368 |
| 8,772,168 | B2 * | 7/2014 | Xie et al. ...................... | 438/700 |
| 2007/0262451 | A1 * | 11/2007 | Rachmady et al. ........... | 257/758 |
| 2011/0062501 | A1 * | 3/2011 | Soss et al. ..................... | 257/288 |
| 2011/0136313 | A1 * | 6/2011 | Lee et al. ...................... | 438/299 |
| 2012/0139061 | A1 * | 6/2012 | Ramachandran et al. .... | 257/410 |
| 2013/0043592 | A1 * | 2/2013 | Park et al. ..................... | 257/754 |
| 2013/0154012 | A1 * | 6/2013 | Fu et al. ........................ | 257/368 |
| 2013/0187203 | A1 * | 7/2013 | Xie et al. ...................... | 257/288 |
| 2013/0187229 | A1 * | 7/2013 | Cheng et al. .................. | 257/347 |
| 2013/0270648 | A1 * | 10/2013 | Manabe ........................ | 257/369 |

FOREIGN PATENT DOCUMENTS

| | | |
|---|---|---|
| JP | 11-067904 | 3/1999 |
| JP | 11-087657 | 3/1999 |
| JP | 2001-267561 | 9/2001 |

(Continued)

*Primary Examiner* — Christine Enad
(74) *Attorney, Agent, or Firm* — F. Chau & Associates, LLC (57) ABSTRACT

A method for manufacturing a semiconductor device is provided. The method includes forming an insulation film including a trench on a substrate, forming a first metal gate film pattern along side and bottom surfaces of the trench, forming a second metal gate film on the first metal gate film pattern and the insulation film, and forming a second metal gate film pattern positioned on the first metal gate film pattern by removing the second metal gate film to expose at least a portion of the insulation film and forming a blocking layer pattern on the second metal gate film pattern by oxidizing an exposed surface of the second metal gate film pattern.

13 Claims, 10 Drawing Sheets

(56) References Cited

FOREIGN PATENT DOCUMENTS

| JP | 2002-217319 | 8/2002 |
|----|----|----|
| KR | 10-2001-0054870 A | 7/2001 |
| KR | 10-2002-0002070 A | 1/2002 |
| KR | 10-2002-0003624 A | 1/2002 |
| KR | 10-2002-0029531 A | 4/2002 |
| KR | 10-2003-0057879 A | 7/2003 |

* cited by examiner

METHOD FOR MANUFACTURING SEMICONDUCTOR DEVICE

TECHNICAL FIELD

The present invention relates to a method for manufacturing a semiconductor device.

DISCUSSION OF THE RELATED ART

Designers of semiconductor devices design higher density by including more transistors, contacts, and signal lines while decreasing component and line spacing. Such high density design increases the occurrence of cross-talk and short circuits.

A method for manufacturing a semiconductor device that avoids short circuits between a wiring such as SAC (Self-Aligned Contact) and a metal gate is provided. Additionally, a method is also provided for manufacturing a semiconductor device that is compatible with a replacement metal gate (RMG) process, reduces gate resistance, and avoids short circuits.

SUMMARY

At least one embodiment of the present invention provides a method for manufacturing a semiconductor device, which can prevent a short circuit between a metal gate and a contact by forming a blocking layer that can protect an entire top surface of the metal gate.

According to an embodiment of the present invention, there is provided a method for manufacturing a semiconductor device, the method including forming an insulation film including a trench on a substrate, forming a first metal gate film pattern conformally along side and bottom surfaces of the trench, wherein a first height from the substrate to an exposed top surface of the insulation film is greater than a second height ranging from the substrate to a top surface of the first gate metal film pattern adjacent to the side surfaces of the trench, forming a second metal gate film on the first metal gate film pattern and the insulation film, and forming a second metal gate film pattern positioned on the first metal gate film pattern by performing a planarization process for removing the second metal gate film to expose at least a portion of the insulation film and forming a blocking layer pattern on the second metal gate film pattern by oxidizing an exposed surface of the second metal gate film pattern.

According to an embodiment of the present invention, there is provided a method for manufacturing a semiconductor device, the method including forming an insulation film including a trench on a substrate, forming a first metal gate film pattern conformally along side and bottom surfaces of the trench, forming a sacrificial gate film pattern on the first metal gate film pattern, while removing the sacrificial gate film pattern, removing portions of the side surfaces of the first metal gate film pattern to reduce heights of the side surfaces of the first metal gate film pattern, forming a second metal gate film pattern on the first metal gate film pattern and the insulation film, forming a second metal gate film pattern on the first metal gate film pattern by performing a planarization process for removing the second metal gate film to expose at least a portion of the insulation film, and forming a blocking layer pattern covering the exposed surface of the second metal gate film pattern.

According to an embodiment of the present invention, there is provided a semiconductor device including an insulation film on a substrate, the insulation film including a trench, a first metal gate film pattern along side and bottom surfaces of the trench, a second metal gate film pattern covering the first metal gate film pattern, and a blocking layer pattern on the second metal gate film pattern, wherein the blocking layer prevents the first metal gate film pattern and the second metal gate film pattern from being externally exposed.

BRIEF DESCRIPTION OF THE DRAWINGS

The embodiments of the present invention will become more apparent from the detail description with reference to the attached drawings in which.

DETAILED DESCRIPTION OF THE EMBODIMENTS

Embodiments of the present invention will now be described in more detail hereinafter with reference to the accompanying drawings. This invention may, however, be embodied in different forms and should not be construed as limited to the embodiments set forth herein. The same reference numbers may indicate the same or substantially the same components throughout the specification and the drawings. Throughout the drawings, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The use of the terms "a" and "an" and "the" and similar referents in the context of describing the invention (especially in the context of the following claims) may be construed to cover both the singular and the plural, unless otherwise indicated herein or clearly contradicted by context.

FIGS. 1 to 10 are cross-sectional views for describing methods for manufacturing semiconductor devices according to embodiments of the present invention.

Figure 1:
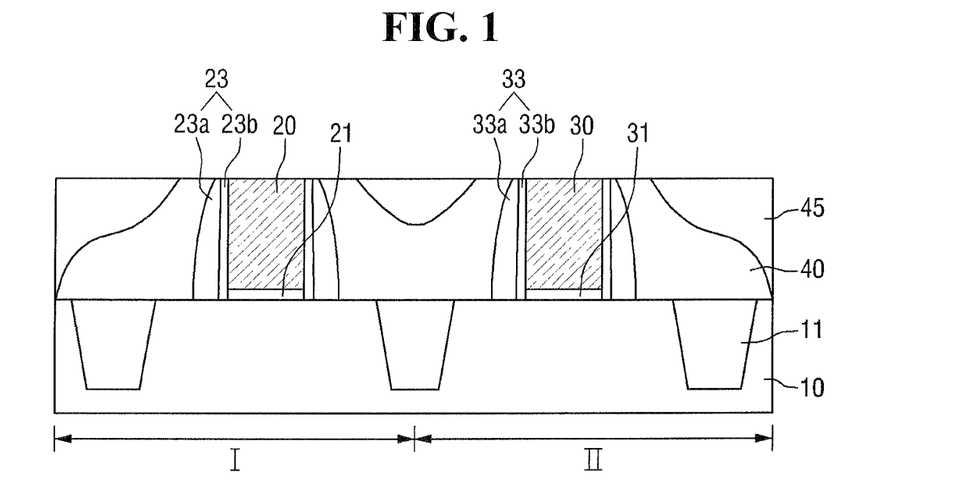
FIGS. 1 to 10 are cross-sectional views for describing methods for manufacturing semiconductor devices according to embodiments of the present invention.

Referring to FIG. 1, a substrate 10 may include a plurality of isolation regions 11. The substrate 10 may include, for example, a silicon substrate, a gallium arsenic substrate, a silicon germanium substrate, a ceramic substrate, a quartz substrate, or a glass substrate for display, and a SOI (Semiconductor On Insulator) substrate, but is not limited thereto. The isolation regions 11 may include oxide films formed by LOCOS (LOCal Oxidation of Silicon) or STI (Shallow Trench Isolation), but are not limited thereto.

The substrate 10 may include a first region I and a second region II. The first region I may include, for example, an NFET (N-type Field Effect Transistor) region where an n-type field effect transistor is formed, and the second region II may include, for example, a PFET (P-type Field Effect Transistor) region where a p-type field effect transistor is formed.

A first dummy gate film pattern 20 may be formed on the first region I of the substrate 10. The first dummy gate film pattern 20 may include a polysilicon film pattern, but is not limited thereto. A first gate insulation film pattern 21 may be formed between the first dummy gate film pattern 20 and the substrate 10. The first gate insulation film pattern 21 may include, for example, an oxide film pattern, but is not limited thereto. A first spacer 23 may be formed at two sides of the first dummy gate film pattern 20. The first spacer 23 may be, for example, a dual spacer. The first spacer 23 may include a first sub spacer 23a and a second sub spacer 23b. The first spacer 23 may include at least one of an oxide film spacer and a nitride film spacer, but is not limited thereto. The first spacer 23 is not limited to the dual spacer, and the number and thickness of sub spacers included in the first spacer 23 may vary according to embodiments.

A second dummy gate film pattern 30 may be formed on the second region II of the substrate 10. The second dummy gate film pattern 30 may include a polysilicon film pattern, but is not limited thereto. A second gate insulation film pattern 31 may be formed between the second dummy gate film pattern 30 and the substrate 10. The second gate insulation film pattern 31 may include, for example, an oxide film pattern, but is not limited thereto. A second spacer 33 may be formed at two sides of the second dummy gate film pattern 30. The second spacer 33 may be, for example, a dual spacer. The second spacer 33 may include a third sub spacer 33a and a fourth sub spacer 33b. The second spacer 33 may include at least one of an oxide film spacer and a nitride film spacer, but is not limited thereto. The second spacer 33 is not limited to the dual spacer, and the number and thickness of sub spacers included in the second spacer 33 may vary according to embodiments.

A first insulation film 40 and a stress liner 45 may be formed on the substrate 10. For example, the first insulation film 40 and the stress liner 45 may fill a space between the first dummy gate film pattern 20 and the second dummy gate film pattern 30, and the stress liner 45 may be formed on the first insulation film 40. The first insulation film 40 may include at least one of undoped silicate glass (USG) and a silicon oxide film, and the stress liner 45 may include a silicon nitride film, but the embodiments of the present invention are not limited thereto. An intermediate structure as shown in FIG. 1 is formed by planarizing top surfaces of the first insulation film 40 and the stress liner 45 by chemical mechanical polishing (CMP).

Figure 2:
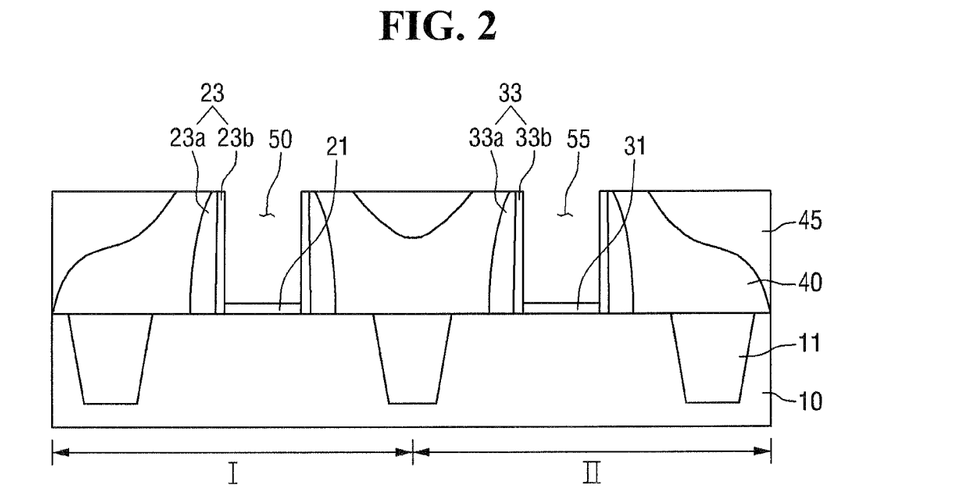

Referring to FIG. 2, the first dummy gate film pattern 20 is removed to form a first trench 50, and the second dummy gate film pattern 30 is removed to form a second trench 55.

For example, a light stream wet etching process is performed to remove the first and second dummy gate film patterns 20 and 30. However, portions of the first and second dummy gate film patterns 20 and 30 may remain. The remaining first and second dummy gate film patterns 20 and 30 may be removed by performing, for example, an ashing process using $H_2N_2$. After the first and second dummy gate film patterns 20 and 30 are removed, first and second trenches 50 and 55 may be formed in the first insulation film 40 positioned on the substrate 10. The first trench 50 may be formed on the first region I of the substrate 10, and the second trench 55 may be formed on the second region II of the substrate 10.

As described above, when the first and second dummy gate film patterns 20 and 30 are removed by performing the two-step process (for example, light stream wet etching and ashing), over etching, which may occur by using the light stream wet etching process to simultaneously remove the first and second dummy gate film patterns 20 and 30, may be prevented. Therefore, it is possible to prevent a height of a semiconductor device from being reduced due to over etching, but the embodiments of the present invention are not limited thereto. The first and second dummy gate film patterns 20 and 30 may be removed at the same time by performing a single-step process.

Figure 3:
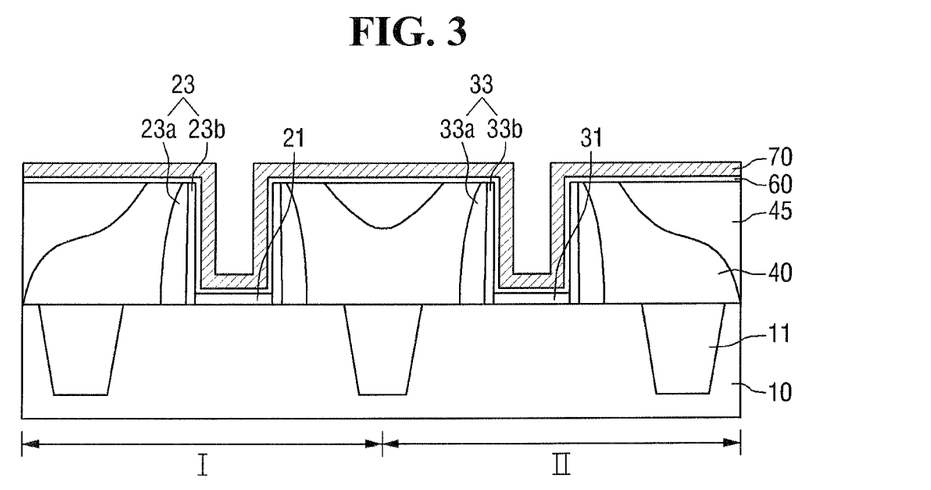

Referring to FIG. 3, a first high-k film 60 and a first metal gate film 70 may be sequentially formed along a top surface of the first insulation film 40 and side and bottom surfaces of the first and second trenches 50 and 55. The first high-k film 60 and the first metal gate film 70 may be formed conformally along the top surface of the first insulation film 40 and the side and bottom surfaces of the first and second trenches 50 and 55. The first metal gate film 70 may be formed on the first high-k film 60.

The first high-k film 60 may have a higher dielectric constant (high-K) than a silicon oxide film, and may include, for example, hafnium silicate, zirconium silicate, hafnium dioxide, and/or dioxide, but is not limited thereto.

The first metal gate film 70 may be, for example, a triple-layered film. The first metal gate film 70 may include, for example, a lower film including TiN, an intermediate film including TaN and an upper film including TiN, but is not limited thereto. The material forming the first metal gate film 70 may vary according to embodiments.

Figure 4:
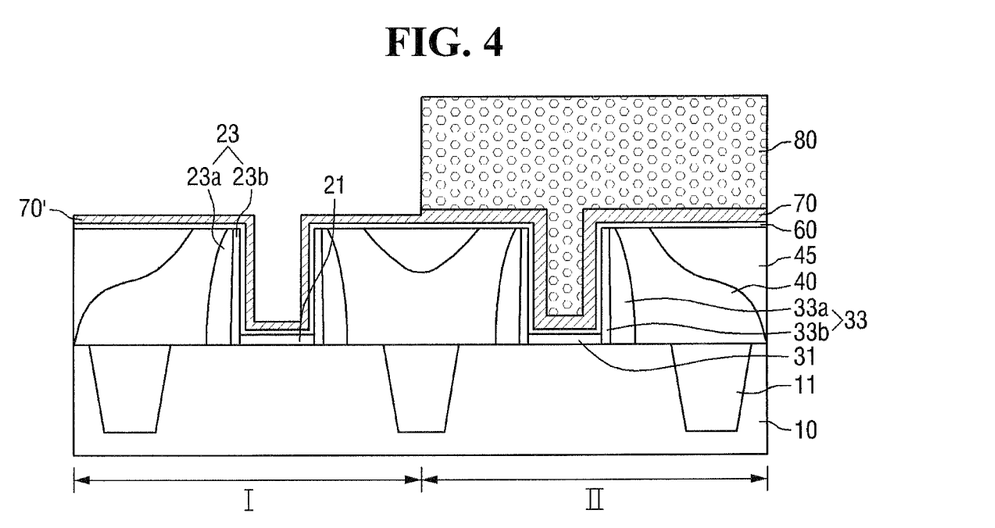

Referring to FIG. 4, the upper film including TiN may be removed from the first metal gate film 70 formed on the first region I of the substrate 10.

A mask film 80 may be formed on the second region II of the substrate 10 and then the upper film including TiN may be removed from the first metal gate film 70 formed on the first region I of the substrate 10. However, since the mask film 80 covers the first metal gate film 70 formed on the second region II, the upper film including TiN of the first metal gate film 70 formed on the second region II can be prevented from being removed.

A first metal gate film 70' formed on the first region I may include, for example, a lower film including TiN and an intermediate film including TaN, and the first metal gate film 70 formed on the second region II may include, for example, a lower film including TiN, an intermediate film including TaN, and an upper film including TiN.

Figure 5:
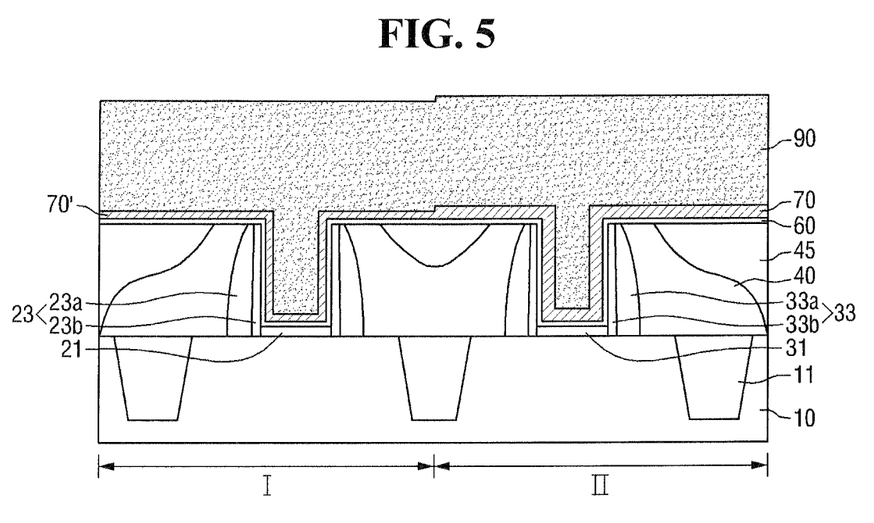

Referring to FIG. 5, the mask film 80 may be removed and a sacrificial gate film 90 may then be formed on the first metal gate films 70 and 70'. The sacrificial gate film 90 may include at least one of a silicon nitride film and a carbon film, but is not limited thereto.

Figure 6:
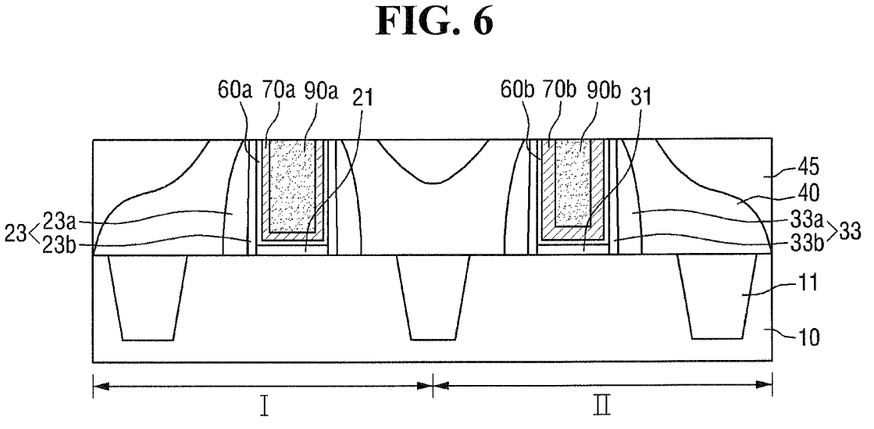

Referring to FIG. 6, a planarization process may be performed to remove the first high-k film 60, the first gate film patterns 70 and 70' and the sacrificial gate film 90 to expose at least a portion of the first insulation film 40.

The planarization process may include, for example, a chemical mechanical polishing (CMP) process.

The CMP process may be performed using slurry for planarizing a structure resulting after removing the first high-k film 60, the first gate film patterns 70 and 70' and the sacrificial gate film 90.

As a result of performing the planarization process, a first-first high-k film pattern 60a may be formed on the first region I of the substrate 10 conformally along the side and bottom surfaces of the first trench 50. A first-first metal gate film pattern 70a may be formed on the first-first high-k film pattern 60a conformally along the side and bottom surfaces of the first trench 50. The first-first metal gate film pattern 70a may include, for example, a lower film including TiN and an intermediate film including TaN. A first sacrificial gate film pattern 90a may be formed on the first-first metal gate film pattern 70a.

The first-first high-k film pattern 60a and the first-first metal gate film pattern 70a may be formed to have a U-shaped section along the side and bottom surfaces of the first trench 50.

As a result of performing the planarization process, a first-second high-k film pattern 60b may be formed on the second region II of the substrate 10 conformally along the side and bottom surfaces of the second trench 55. A first-second metal gate film pattern 70b may be formed on the first-second high-k film pattern 60b conformally along the side and bottom surfaces of the second trench 55. The first-second metal gate film pattern 70b may include, for example, a lower film including TiN, an intermediate film including TaN and an upper film including TiN. A second sacrificial gate film pattern 90b may be formed on the first-second metal gate film pattern 70b.

The first-second high-k film pattern 60b and the first-second metal gate film pattern 70b may be formed to have a U-shaped section along the side and bottom surfaces of the second trench 55.

Figure 7:
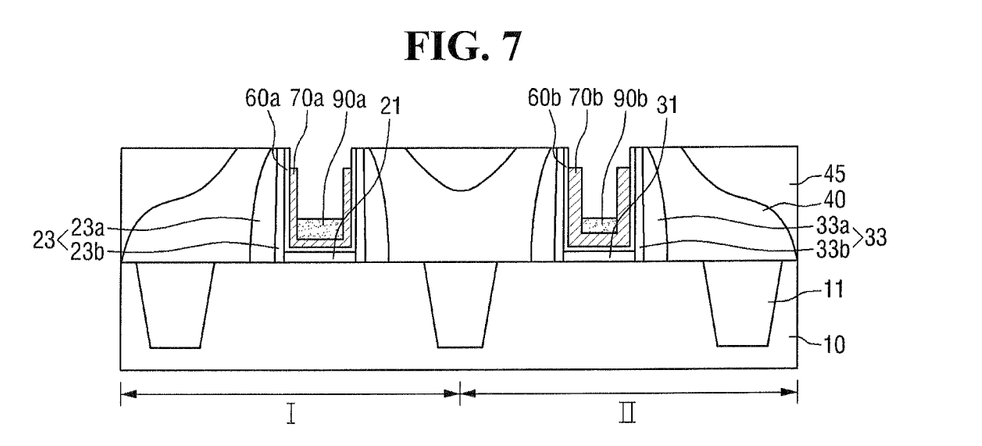

Referring to FIG. 7, while removing the first and second sacrificial gate film patterns 90a and 90b, portions of the side portions of the first-first and first-second metal gate film patterns 70a and 70b may be removed to reduce heights of the side portions of the first-first and first-second metal gate film patterns 70a and 70b. Portions of the first and second sacrificial gate film patterns 90a and 90b may remain.

A metal gate pull back process may be performed to etch a majority of portions of the first and second sacrificial gate film patterns 90a and 90b and to etch portions of the side portions of the first-first and first-second metal gate film patterns 70a and 70b by a predetermined length. For example, the first and second sacrificial gate film patterns 90a and 90b and the first-first and first-second metal gate film patterns 70a and 70b may be simultaneously etched, for example, dry etching. For example, according to an embodiment, the dry etching may be performed using a reactive ion etching ((RIE) process.

The first and second sacrificial gate film patterns 90a and 90b may include at least one of a silicon nitride film pattern or a carbon film pattern. The first-first and first-second metal gate film patterns 70a and 70b may include metal films. For example, according to an embodiment, the first-first metal gate film pattern 70a may include a lower film including TiN and an intermediate film including TaN, and the first-second metal gate film pattern 70b may include a lower film including TiN, an intermediate film including TaN and an upper film including TiN.

When materials of the first and second sacrificial gate film patterns 90a and 90b are compared with materials of the first-first and first-second metal gate film patterns 70a and 70b, the first and second sacrificial gate film patterns 90a and 90b may include relatively more porous materials. The first-first and first-second metal gate film patterns 70a and 70b may include relatively harder materials. A processing condition of higher etching selectivity to the first and second sacrificial gate film patterns 90a and 90b than to the first-first and first-second metal gate film patterns 70a and 70b may be created. Therefore, when dry etching is performed using an RIE process, the first and second sacrificial gate film patterns 90a and 90b may be etched more than the first-first and first-second metal gate film patterns 70a and 70b.

While dry etching is performed, the first-first and first-second metal gate film patterns 70a and 70b are removed more slowly than the first and second sacrificial gate film patterns 90a and 90b. For example, while relatively large portions of the first and second sacrificial gate film patterns 90a and 90b are removed, relatively small portions of the side portions of the first-first and first-second metal gate film patterns 70a and 70b may be removed.

Accordingly, a first height from the substrate 10 to an exposed top surface of the first insulation film 40 may be greater than a second height from the substrate 10 to a top surface of each of the first-first and first-second metal gate film patterns 70a and 70b adjacent to the side surfaces of the first and second trenches (50 and 55 of FIG. 2). When a height of each of the first and second spacers 23 and 33 adjacent to the first-first and first-second metal gate film patterns 70a and 70b is referred to as a third height, the third height may be greater than the second height.

Each of the first-first and first-second metal gate film patterns 70a and 70b may have a U-shaped section along the side and bottom surfaces of the first and second trenches 50 and 55. Top surfaces of the first-first and first-second metal gate film patterns 70a and 70b may be separated from top surfaces of the first and second trenches 50 and 55.

Figure 8:
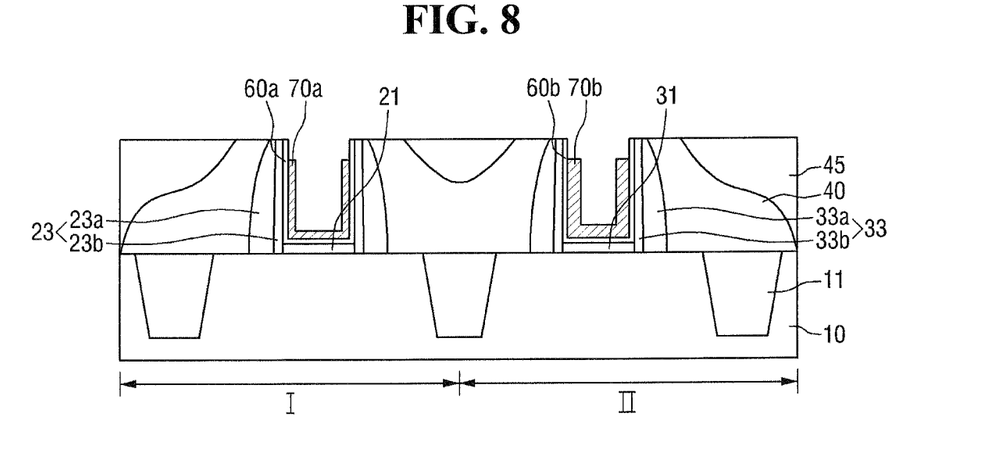

Referring to FIG. 8, the remaining first and second sacrificial gate film patterns 90a and 90b may be removed by, for example, wet etching. For example, the wet etching may be performed using a phosphoric acid (e.g., $H_2PO_4$). According to an embodiment, etching selectivity of the first and second sacrificial gate film patterns 90a and 90b to the first-first and first-second metal gate film patterns 70a and 70b may be about 200:1 or greater. Therefore, while the first and second sacrificial gate film patterns 90a and 90b are removed, a very small quantity of the first-first and first-second metal gate film patterns 70a and 70b may be removed.

Figure 9:
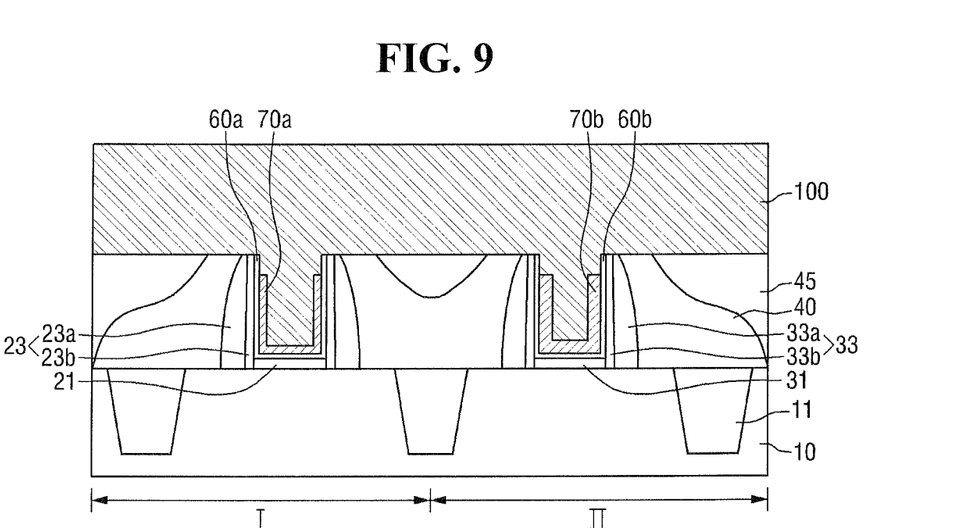

Referring to FIG. 9, a second metal gate film 100 may be formed on the first insulation film 40 and the first-first and first-second metal gate film patterns 70a and 70b.

The second metal gate film 100 may be, for example, a triple-layered film. The second metal gate film 100 may include, for example, a lower film including TiN, an intermediate film including TaN and an upper film including TiN, but is not limited thereto.

Figure 10:
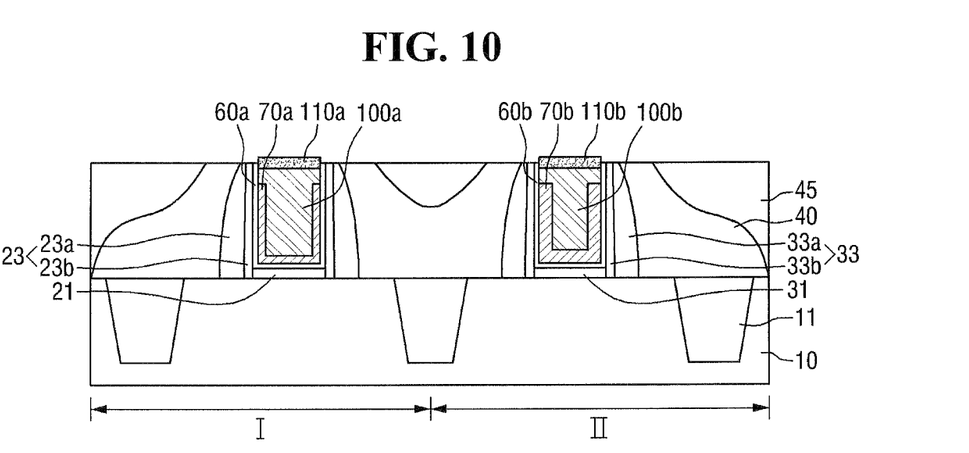

Referring to FIG. 10, a planarization process may be performed to remove the second metal gate film 100 so that at least a portion of the first insulation film 40 is removed, thereby forming a second-first metal gate film pattern 100a on a first-first metal gate film pattern 70a and a second-second metal gate film pattern 100b on the first-second metal gate film pattern 70b. During the planarization process, exposed surfaces of the second-first and second-second metal gate film patterns 100a and 100b are oxidized, thereby forming first and second blocking layer patterns 110a and 110b on the second-first and second-second metal gate film patterns 100a and 100b, respectively.

According to an embodiment, the planarization process may include, for example, a chemical mechanical polishing (CMP) process. The CMP process may be performed using slurry for planarizing a structure resulting after removing the first second metal gate film 100.

A portion of the second metal gate film 100 may be removed to form the second-first metal gate film pattern 100a on the first region I of the substrate 10 and to form the second-second metal gate film pattern 100b on the second region II of the substrate 10.

The second-first metal gate film pattern 100a having a T-shaped section may be formed on the first-first metal gate film pattern 70a having a U-shaped section. A metal gate formed on the first region I of the substrate 10 may include a first-first metal gate film pattern 70a and a second-first metal gate film pattern 100a and may have a five-layered structure of TiN—TaN—TiAl—TiN—Ti/Al, but the embodiments of the present invention are not limited thereto.

Alternatively, the second-second metal gate film pattern 100b having a T-shaped section may be formed on the first-second metal gate film pattern 70b having a U-shaped section. A metal gate formed on the second region II of the substrate 10 may include a first-second metal gate film pattern 70b and a second-second metal gate film pattern 100b and may have a six-layered structure of TiN—TaN—TiN—TiAl—TiN—Ti/Al, but the embodiments of the present invention are not limited thereto.

During the planarization process, e.g., CMP, an oxidization process may be performed.

The exposed surfaces of the second-first and second-second metal gate film patterns 100a and 100b may be oxidized by the oxidation process. The planarization process may oxidize the exposed surfaces of the second-first and second-second metal gate film patterns 100a and 100b, thereby forming the first and second blocking layer patterns 110a and 110b on the second-first and second-second metal gate film patterns 100a and 100b, respectively. The first and second blocking layer patterns 110a and 110b may include oxide films, for example, aluminum oxide films.

According to an embodiment, forming the second-first and second-second metal gate film patterns 100a and 100b and forming the first and second blocking layer patterns 110a and 110b may be simultaneously performed by the planarization process.

The first blocking layer pattern 110a may cover an entire top surface of the second-first metal gate film pattern 100a, and the second blocking layer pattern 110b may cover an entire top surface of the second-second metal gate film pattern 100b. The first and second blocking layer patterns 110a and 110b may prevent the second-first and second-second metal gate film patterns 100a and 100b from being exposed to the outside.

The removed portions of the side portions of the first-first and first-second metal gate film patterns 70a and 70b may be filed with the second-first and second-second metal gate film patterns 100a and 100b, respectively. Since the first-first and first-second metal gate film patterns 70a and 70b are covered by the second-first and second-second metal gate film patterns 100a and 100b, respectively, the first-first and first-second metal gate film patterns 70a and 70b are not exposed to the outside. Since the first and second blocking layer patterns 110a and 110b are formed on the second-first and second-second metal gate film patterns 100a and 100b, respectively, the first-first and first-second metal gate film patterns 70a and 70b may be protected by the second-first and second-second metal gate film patterns 100a and 100b and the first and second blocking layer patterns 110a and 110b.

A method for manufacturing semiconductor device according to an embodiment of the present invention will now be described with reference to FIGS. 1 to 6 and FIGS. 8 to 10.

The same or substantially the same process steps as described in connection with FIGS. 1 to 6 are performed.

Referring to FIG. 8, while removing the first and second sacrificial gate film patterns 90a and 90b, portions of the side portions of the first-first and first-second metal gate film patterns 70a and 70b may be removed so that heights of the side portions of the first-first and first-second metal gate film patterns 70a and 70b are reduced. The first and second sacrificial gate film patterns 90a and 90b are completely removed by performing a single-step process, unlike in the method described in connection with FIGS. 7 and 8 in which the first and second sacrificial gate film patterns 90a and 90b are removed by performing the two-step process (e.g., RIE and wet etching).

The same or substantially the same process steps as described in connection with FIGS. 9 and 10 are performed.

Figure 11:
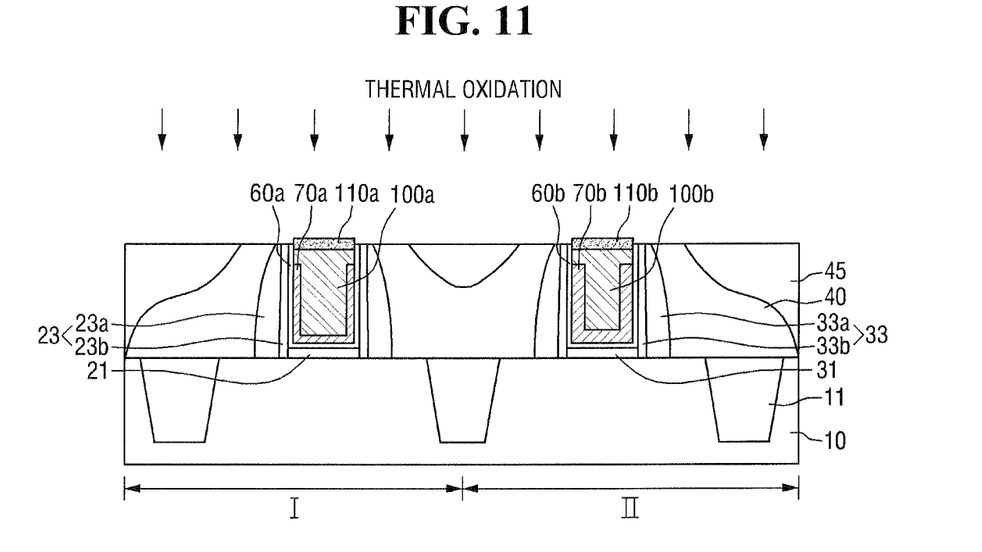
FIG. 11 is a cross-sectional view for describing a method for manufacturing a semiconductor device according to an embodiment of the present invention.

A method for manufacturing a semiconductor device according to an embodiment of the present invention will now be described with reference to FIGS. 1 to 11. FIG. 11 is a cross-sectional view for describing a method for manufacturing a semiconductor device according to an embodiment of the present invention.

The same or substantially the same process steps as described in connection with FIGS. 1 to 10 are performed.

As shown in FIG. 11, a thermal oxidation process may further be performed. Referring to FIG. 11, second-first and second-second metal gate film patterns 100a and 100b are thermally oxidized, thereby increasing thicknesses of the first and second blocking layer patterns 110a and 110b.

Hereinafter, a method for forming self-aligned contacts on semiconductor devices according to an embodiment of the present invention will be described with reference to FIGS. 12 to 17. FIGS. 12 to 17 are cross-sectional views for describing a method for forming self-aligned contacts on semiconductor devices according to an embodiment of the present invention.

Figure 12:
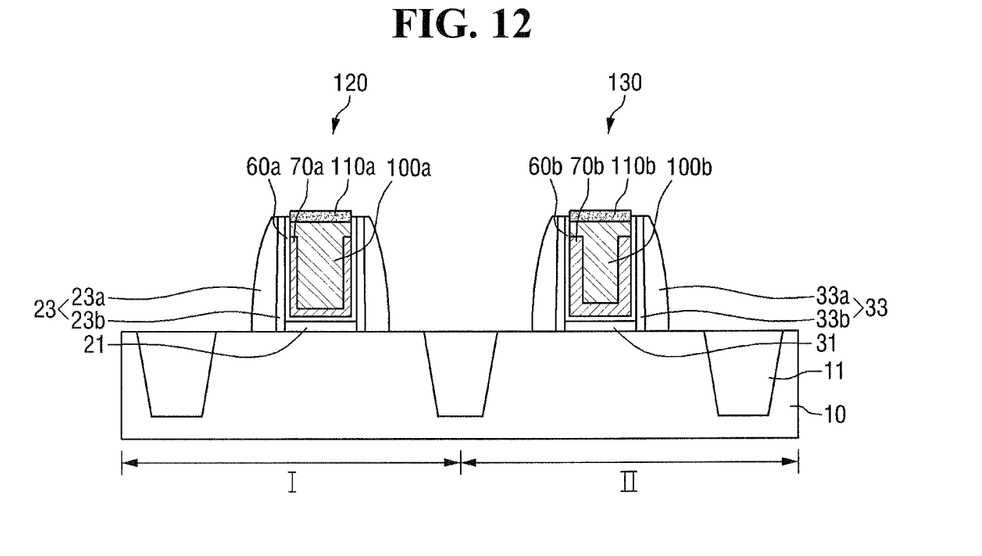
FIGS. 12 to 17 are cross-sectional views for describing a method for forming self-aligned contacts on semiconductor devices according to an embodiment of the present invention.

Referring to FIG. 12, a first insulation film 40 and a stress liner 45 provided on a substrate 10 may be removed by, for example, wet etching.

First and second gate structures 120 and 130 may be respectively formed on first and second regions I and II of the substrate 10. The first gate structure 120 may include, for example, a first gate insulation film pattern 21, a first spacer 23, a first-first high-k film pattern 60a, a first-first metal gate film pattern 70a, a second-first metal gate film pattern 100a, and a first blocking layer pattern 110a. The second gate structure 130 may include, for example, a second gate insulation film pattern 31, a second spacer 33, a first-second high-k film pattern 60b, a first-second metal gate film pattern 70b, a second-second metal gate film pattern 100b, and a second blocking layer pattern 110b.

Figure 13:
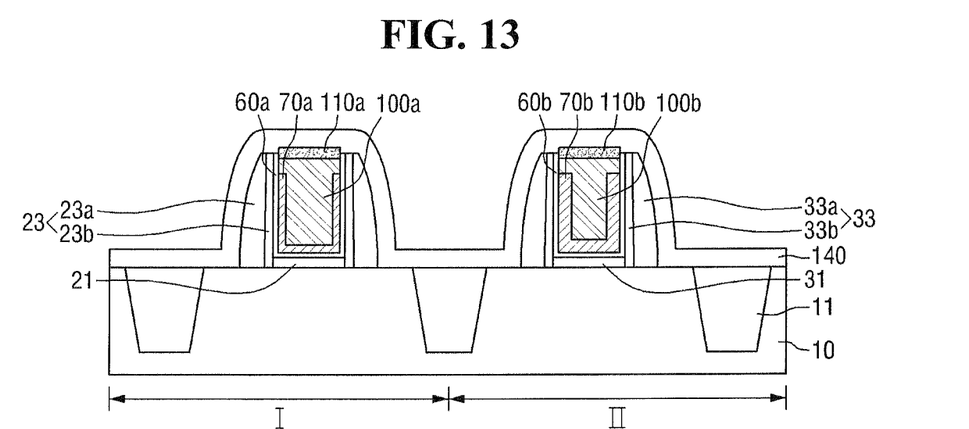

Referring to FIG. 13, a second high-k film 140 may be formed on the substrate 10, the first and second spacers 23 and 33, and the first and second blocking layer patterns 110a and 110b. The second high-k film 140 may protect the first and second gate structures 120 and 130. The second high-k film 140 may include, for example, hafnium silicate, zirconium silicate, hafnium dioxide, and/or dioxide. The second high-k film 140 may be deposited by chemical vapor deposition (CVD) or atomic layer deposition (ALD).

Figure 14:
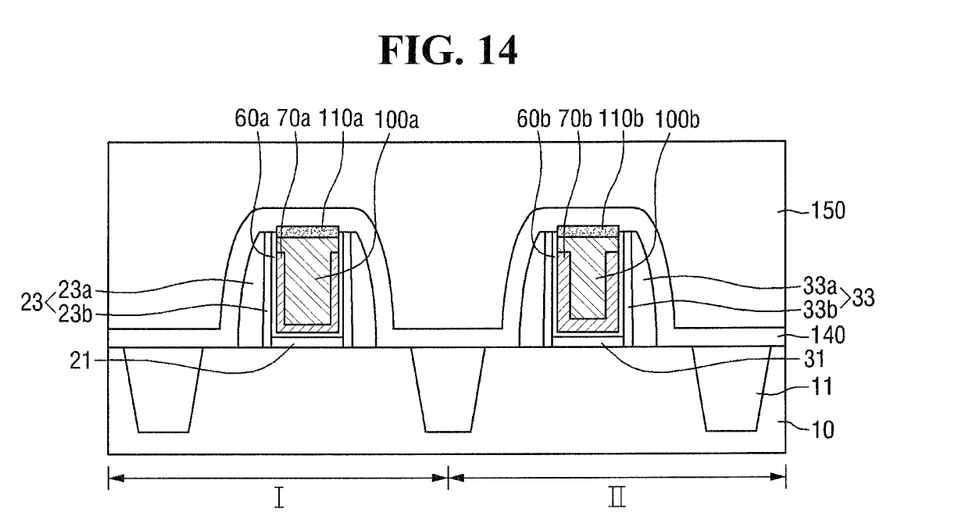

Referring to FIG. 14, an interlayer dielectric film 150 including at least one of a silicon nitride film (SiN) and a silicon oxide film ($SiO_2$) may be formed on the second high-k film 140. The interlayer dielectric film 150 may be deposited by chemical vapor deposition (CVD) or atomic layer deposition (ALD).

Figure 15:
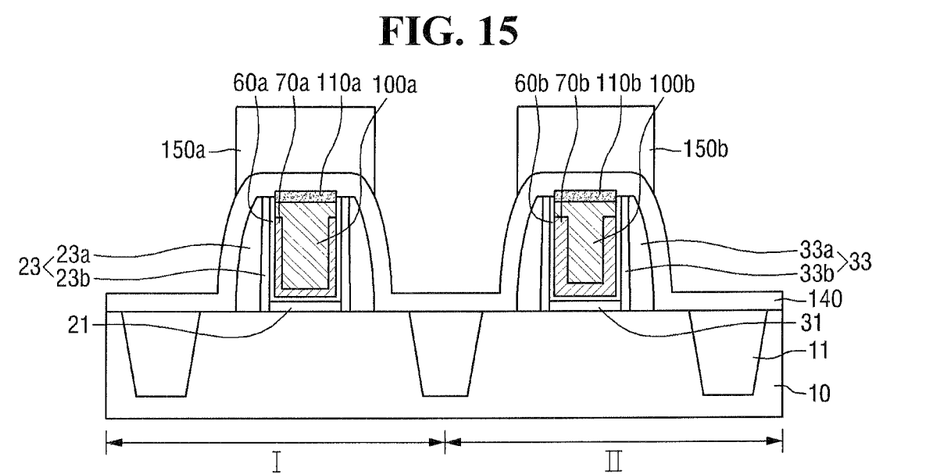

Referring to FIG. 15, the interlayer dielectric film 150 may be patterned by, for example, wet etching. For example, a mask film may be formed on the first gate structure 120 and the second gate structure 130, and the interlayer dielectric film 150 may be then patterned. As a result, the interlayer dielectric film 150 not overlapping the first and second gate structures 120 and 130 may be removed. For example, the interlayer dielectric film 150 positioned between the first gate structure 120 and the second gate structure 130 may be removed. As a result, first and second interlayer dielectric film patterns 150a and 150b may be formed on the first and second gate structures 120 and 130.

Figure 16:
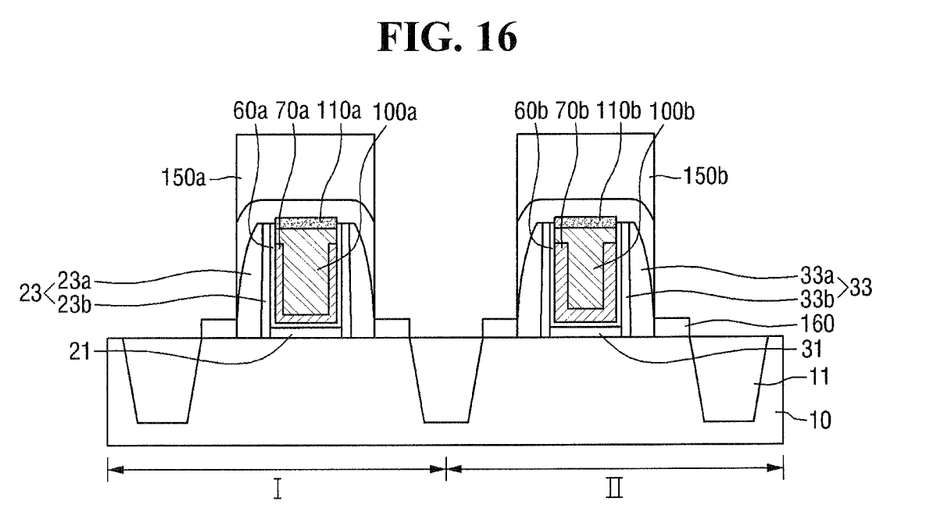

Referring to FIG. 16, the second high-k film 140 not covered by the first and second interlayer dielectric film patterns 150a and 150b may be removed. For example, the second high-k film 140 positioned between the first gate structure 120 and the second gate structure 130 may be removed. As a result, second-first and second-second high-k film patterns 140a and 140b may be formed on the first and second gate structures 120 and 130.

After a portion of the second high-k film 140 is removed, nickel (Ni) may be deposited on the substrate 10. Then, when the substrate 10 with nickel (Ni) deposited thereon is annealed, nickel (Ni) reacts with the substrate 10, thereby forming a silicide pattern 160. Then, unreacted nickel (Ni) may be removed. Forming the silicide pattern 160 may reduce sheet resistance.

Figure 17:
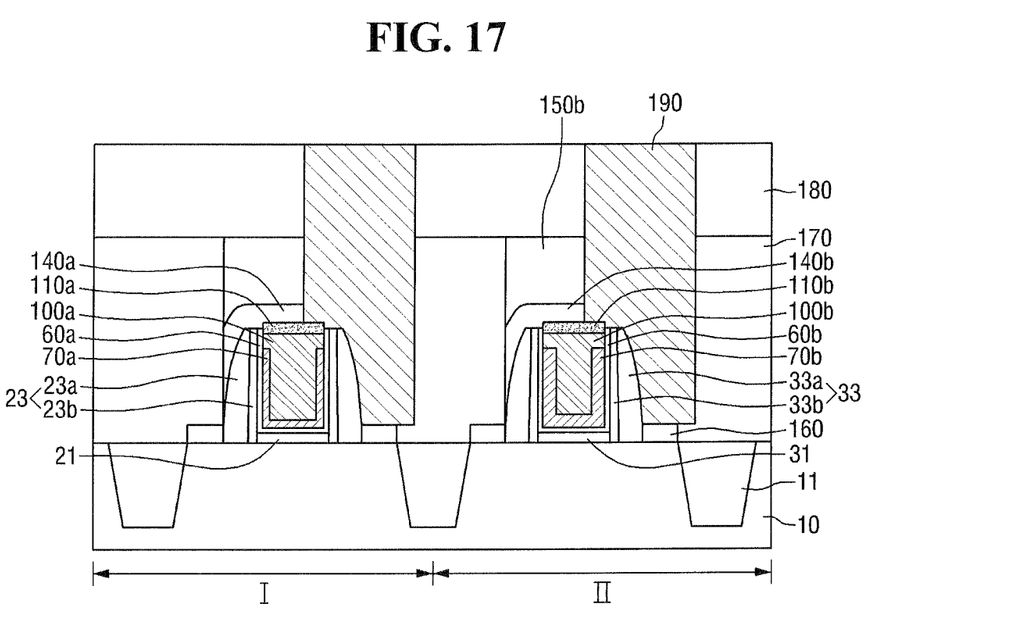

Referring to FIG. 17, a second insulation film 170 including a silicon nitride film (SiN) or a silicon oxide film ($SiO_2$) and a third insulation film 180 including tetraethoxysilane (TEOS) or undoped silicate glass (USG) may be formed on the structure shown in FIG. 17. According to an embodiment, the silicon nitride film (SiN), the silicon oxide film ($SiO_2$) and TEOS may be deposited by, for example, CVD or ALD.

Next, CMP, etching, and metal deposition are performed to form a self-aligned contact (SAC) 190 as shown in FIG. 17. For example, the second insulation film 170 deposited on the silicide pattern 160 and the third insulation film 180 are etched to form a via that is then filled with a metal, and a planarization process is performed by CMP, thereby forming the SAC 190. According to an embodiment, the SAC 190 may be, for example, tungsten (W), but is not limited thereto.

Portions of the second-first and second-second high-k films 140a and 140b and the first and second interlayer dielectric film patterns 150a and 150b formed on the second-first and second-second metal gate film patterns 100a and 100b may be removed and filled with the SAC 190. The first and second blocking layer patterns 110a and 110b formed between top surfaces of the second-first and second-second metal gate film patterns 100a and 100b and the SAC 190 may prevent an electrical short circuit from occurring between the second-first and second-second metal gate film patterns 100a and 100b and the SAC 190 or a wire connected to the SAC 190 since the second-first and second-second metal gate film patterns 100a and 100b do not contact the SAC 190 due to the first and second blocking layer patterns 110a and 110b.

Figure 18:
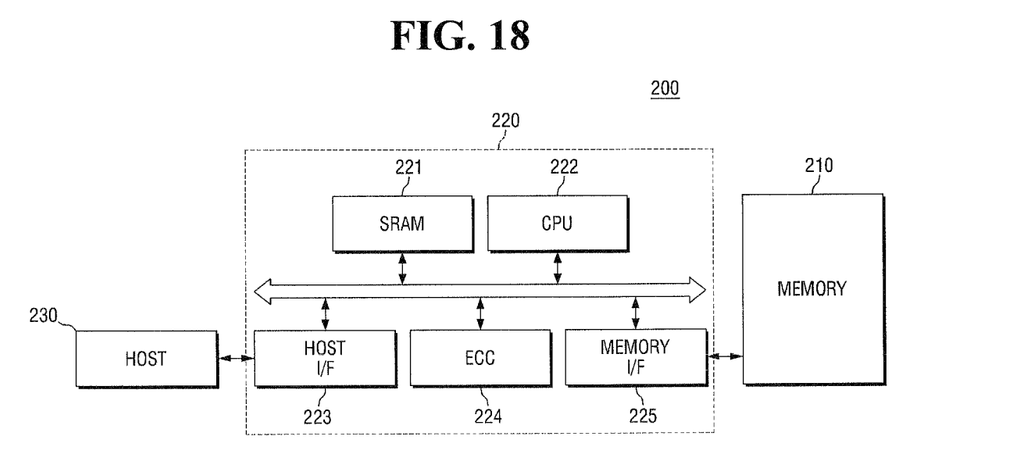
FIG. 18 is a block diagram illustrating a memory card including a semiconductor device according to an embodiment of the present invention.

FIG. 18 is a block diagram illustrating a memory card including a semiconductor device according to an embodiment of the present invention.

Referring to FIG. 18, a memory 210 including semiconductor devices manufactured according to embodiments of the present invention may be included in a memory card 200. The memory card 200 may include a memory controller 220 that controls data exchange between a host 230 and the memory 210. A static random access memory (SRAM) 221 may be used as an operation memory of a central processing unit (CPU) 222. A host interface (I/F) 223 may include a protocol to allow the host 230 to access the memory card 200 for data exchange. An error correction code unit (ECC) 224 may detect an error of data read from the memory 210 and may correct the detected error. The memory I/F 225 may interface with the memory 210. The CPU 222 may perform the overall control operation associated with data exchange of the memory controller 220.

Figure 19:
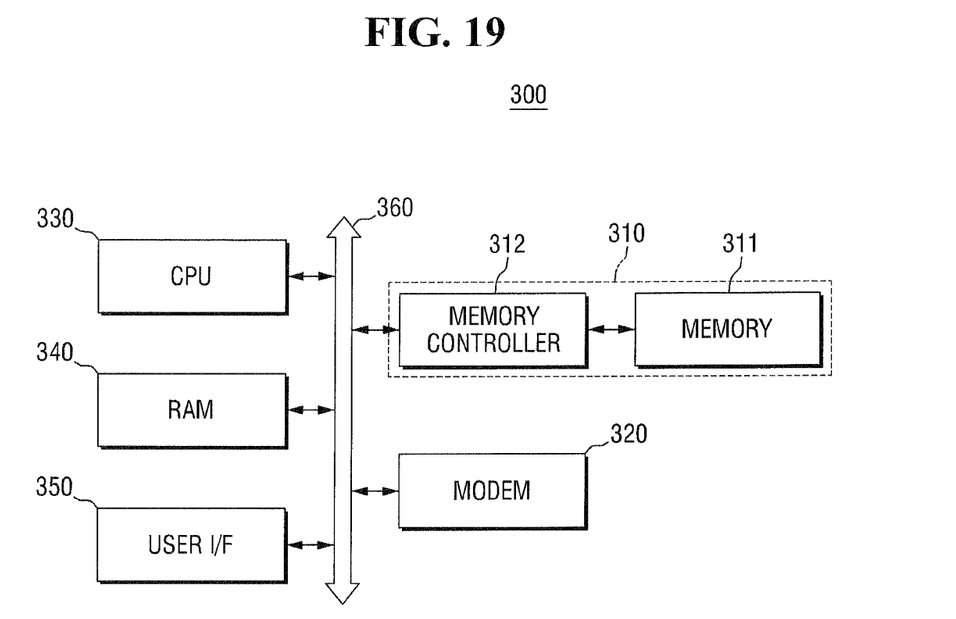
FIG. 19 is a block diagram illustrating an information processing system using a semiconductor device according to an embodiment of the present invention.

FIG. 19 is a block diagram illustrating an information processing system using a semiconductor device according to an embodiment of the present invention.

Referring to FIG. 19, an information processing system 300 may include a memory system 310 including semiconductor devices manufactured according to embodiments of the present invention. The information processing system 300 may include the memory system 310 electrically connected to a system bus 360, a modem 320, a CPU 330, an RAM 340 and a user interface (I/F) 350. The memory system 310 may include a memory 311 and a memory controller 312 and may have substantially the same configuration as the memory card 200 shown in FIG. 18. The data processed by the CPU 330 or data received from an external device may be stored in the memory system 310. The information processing system 300 may be included in a memory card, a solid state disk (SSD), a camera image sensor, and various chip sets. For example, the memory system 310 may be configured to employ an SSD. The information processing system 300 may process large capacity data in a stable and reliable manner.

Figure 20:
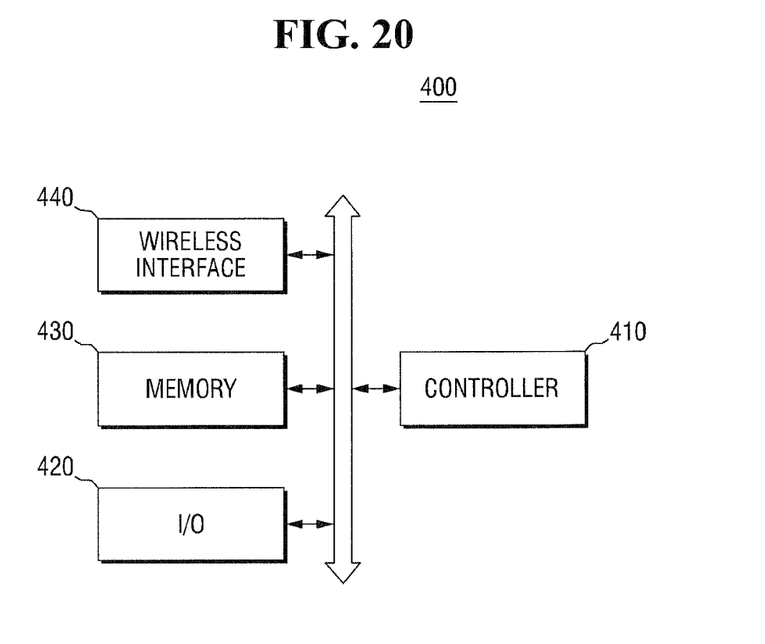
FIG. 20 is a block diagram illustrating an electronic device including a semiconductor device according to an embodiment of the present invention.

FIG. 20 is a block diagram illustrating an electronic device including a semiconductor device according to an embodiment of the present invention.

Referring to FIG. 20, an electronic device 400 may include semiconductor devices manufactured according to embodiments of the present invention. The electronic device 400 may be used in a wireless communication device (for example, PDA, a notebook computer, a portable computer, a web tablet, a cordless phone, and/or a wireless digital music player) or various devices exchanging information in a wireless communication environment.

The electronic device 400 may include a controller 410, an input/output device (I/O) 420, a memory 430, and a wireless interface 440. The memory 430 may include semiconductor devices manufactured according to embodiments of the present invention. The controller 410 may include a microprocessor or a digital signal processor. The memory 430 may be used to store commands (or user data) processed by the controller 410. The wireless interface 440 may be used to exchange data through a wireless data network. The wireless interface 440 may include an antenna and/or a wireless transceiver. The electronic device 400 may use a third generation communication system protocol, such as CDMA, GSM, NADC, E-TDMA, WCDMA, or CDMA 2000.

Those skilled in the art will appreciate that many variations and modifications can be made to the embodiments without substantially departing from the principles of the present invention. The embodiments of the invention are used in a generic and descriptive sense only and not for purposes of limitation.

What is claimed is:

1. A method for manufacturing a semiconductor device, the method comprising:

forming an insulation film including a trench on a substrate;

forming a high-k film pattern along side and bottom surface of the trench;

forming a first metal gate film pattern on the high-k film pattern, wherein a first height from the substrate to an exposed top surface of the insulation film is greater than a second height from the substrate to a top surface of the first gate metal film pattern adjacent to the side surfaces of the trench;

forming a second metal gate film on the first metal gate film pattern and the insulation film;
forming a second metal gate film pattern on the first metal gate film pattern by removing the second metal gate film by a planarization process to expose at least a portion of the insulation film, wherein the second metal gate film pattern has a T-shaped section and fills completely the trench which is filled partially with the first metal gate film pattern, wherein a bottom surface of the T-shaped section directly contacts the first metal gate film pattern and a portion of side surface of the T-shaped section does not directly contact the first metal gate film pattern; and
forming a blocking layer pattern on the second metal gate film pattern by oxidizing an exposed surface of the second metal gate film pattern,
wherein a side surface of the high-k film pattern directly contacts with a side surface of the blocking layer pattern and a side surface of the second metal gate film pattern,
wherein forming the second metal gate film pattern and forming the blocking layer pattern are substantially simultaneously performed by the planarization process,
wherein the second metal gate film pattern directly contacts the first metal gate film pattern and the high-k film pattern,
wherein the first metal gate film pattern formed along the side surfaces of the trench is apart from the blocking layer pattern in a vertical direction, and
wherein the first metal gate film pattern formed along the side surfaces of the trench does not overlap the blocking layer pattern in a horizontal direction.

2. The method of claim 1, wherein the planarization process includes an oxidization process, and the blocking layer pattern includes an oxide film.

3. The method of claim 1, wherein the planarization process includes a chemical mechanical polishing (CMP) process.

4. The method of claim 1, wherein forming the first metal gate film pattern comprises forming the first metal gate film pattern to have a U-shaped section along the side and bottom surfaces of the trench.

5. The method of claim 1, wherein forming the second metal gate film pattern comprises forming the second metal gate film pattern to be positioned on the first metal gate film pattern and to have a T-shaped section.

6. The method of claim 1, wherein the second metal gate film pattern is positioned between the blocking layer pattern and the first metal gate film pattern.

7. The method of claim 1, after forming the insulation film and before forming the first metal gate film pattern, further comprising forming a spacer having a third height at two sides of the trench, wherein the third height is greater than the second height.

8. A method for manufacturing a semiconductor device, the method comprising:
forming an insulation film including a trench on a substrate;
forming a high-k film pattern along side and bottom surfaces of the trench;
forming a first metal gate film pattern on the high k-film pattern;
forming a sacrificial gate film pattern on the first metal gate film pattern;
removing the sacrificial gate film pattern and portions of side portions of the first metal gate film pattern at the same time to reduce heights of the side surfaces of the first metal gate film pattern;
forming a second metal gate film pattern on the first metal gate film pattern and the insulation film;
forming a second metal gate film pattern on the first metal gate film pattern by removing the second metal gate film to expose at least a portion of the insulation film; and
forming a blocking layer pattern covering the exposed surface of the second metal gate film pattern, wherein forming the second metal gate film pattern and forming the blocking layer pattern are substantially simultaneously performed by a planarization process,
wherein the second metal gate film pattern directly contacts the first metal gate film pattern,
wherein the first metal gate film pattern formed along the side surfaces of the trench is apart from the blocking layer pattern in a vertical direction,
wherein the first metal gate film pattern formed along the side surfaces of the trench does not overlap the blocking layer pattern in a horizontal direction, and
wherein a side surface of the high-k film pattern directly contacts a side surface of the blocking layer pattern and a side surface of the second metal gate film pattern.

9. The method of claim 8, wherein removing the sacrificial gate film pattern and the portions of the side portions of the first metal gate film pattern comprises performing an etch process for removing the sacrificial gate film pattern and the first metal gate film pattern when etching selectivity to the sacrificial gate film pattern is higher than etching selectivity to the first metal gate film pattern.

10. The method of claim 8, wherein the sacrificial gate film pattern includes at least one of a silicon nitride film pattern or a carbon film pattern, and wherein removing the sacrificial gate film pattern and the portions of the side portions of the first metal gate film pattern is performed by a reactive ion etching process.

11. The method of claim 8, wherein forming the blocking layer pattern comprises covering the exposed surface of the second metal gate film pattern by oxidizing the exposed surface of the second metal gate film pattern.

12. The method of claim 11, wherein the planarization process includes a chemical mechanical polishing (CMP) process.

13. The method of claim 8, wherein forming the blocking layer pattern comprises covering the exposed surface of the second metal gate film pattern by oxidizing the exposed surface of the second metal gate film pattern.

* * * * *